(12) United States Patent
Shioya et al.

(10) Patent No.: US 7,439,560 B2
(45) Date of Patent: Oct. 21, 2008

(54) SEMICONDUCTOR DEVICE USING SEMICONDUCTOR NANOWIRE AND DISPLAY APPARATUS AND IMAGE PICK-UP APPARATUS USING THE SAME

(75) Inventors: Shunsuke Shioya, Abiko (JP); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/566,434

(22) Filed: Dec. 4, 2006

(65) Prior Publication Data
US 2007/0228421 A1    Oct. 4, 2007

(30) Foreign Application Priority Data
Dec. 6, 2005  (JP)  ............... 2005-352571

(51) Int. Cl.
H01L 29/76 (2006.01)
(52) U.S. Cl. ................ 257/213; 257/746; 257/653; 257/E29.327

(58) Field of Classification Search ........... 257/213, 257/653, 746, E27.133, E29.327, E29.336, 257/E31.038
See application file for complete search history.

(56) References Cited

U.S. PATENT DOCUMENTS

| 6,872,645 | B2 | 3/2005 | Duan et al. |
| 6,882,051 | B2 | 4/2005 | Majumdar et al. |
| 2005/0181587 | A1* | 8/2005 | Duan et al. ............ 438/551 |

* cited by examiner

Primary Examiner—Minh-Loan Tran
Assistant Examiner—Selim Ahmed
(74) Attorney, Agent, or Firm—Morgan & Finnegan, LLP

(57) ABSTRACT

A semiconductor device, comprising a semiconductor nanowire having a first region with one of a PN junction and a PIN junction and a second region with a field effect transistor structure, a pair of electrodes connected to both ends of the semiconductor nanowire, and a gate electrode provided in at least a part of the second region via an insulating layer. The semiconductor nanowire has a P-type semiconductor portion and an N-type semiconductor portion, and one of the P-type semiconductor portion and the N-type semiconductor portion is a common structural element of both the first and second regions.

8 Claims, 6 Drawing Sheets

SEMICONDUCTOR DEVICE USING SEMICONDUCTOR NANOWIRE AND DISPLAY APPARATUS AND IMAGE PICK-UP APPARATUS USING THE SAME

BACKGROUND OF THE INVENTION

1. Field of the Invention

The present invention relates to a semiconductor device using a semiconductor nanowire.

Also, the present invention relates to a semiconductor device which has both a PN or PIN junction device and a field effect transistor using a semiconductor nanowire. Further, the present invention relates to a display apparatus and an image pick-up apparatus using the semiconductor device.

2. Description of the Related Art

A semiconductor nanowire is a wire exhibiting semiconductor characteristics and having a structure of a diameter of about several hundred nanometers or less. Such a semiconductor nanowire is manufactured using, for example, a vapor-liquid-solid (VLS) mechanism.

The VLS mechanism is a method in which metal fine particles on a substrate and the substrate or a desired element form a molten compound alloy, which decomposes a raw material gas to allow a nanowire to grow. The VLS mechanism is known as a method of synthesizing nanowires, various kinds of carbon nanotubes, and oxide whiskers. A semiconductor nanowire manufactured by the above-mentioned method exhibits a very high mobility of several hundred $cm^2/Vs$ to several thousand $cm^2/Vs$. Therefore, it is possible to use the above-mentioned semiconductor nanowire in a field effect transistor (FET) which uses the semiconductor nanowire as its channel, and various studies are made for putting the semiconductor nanowire to practical use (for example, U.S. Pat. No. 6,872,645).

In U.S. Pat. No. 6,872,645, nanowire field effect transistors are manufactured by dispersing the above-mentioned semiconductor nanowires in a solvent and orienting the semiconductor nanowires on a substrate by fluid force. In the manufacturing method disclosed in U.S. Pat. No. 6,872,645, because a transistor can be manufactured in a coating process, a TFT having a high mobility and a large area can be manufactured.

Although a conventional silicon or compound semiconductor transistor has a high mobility, it is difficult to make a large-area transistor because a large-area substrate is difficult to be prepared or a vacuum apparatus is required. On the other hand, in a case of an organic transistor, while a large-area transistor can be manufactured because constraints on the substrate is not so strict and a coating process can be used, the mobility is as low as 0.1 $cm^2/Vs$ or less, which limits uses thereof.

The above-mentioned semiconductor nanowire transistor can solve both of the above-mentioned problems of a transistor at the same time, and thus, a TFT of a large-area and a low cost, and having flexibility or the like can be materialized with performance of an inorganic transistor maintained. Therefore, it can be used for a TFT for an organic EL display, a sheet computer, and the like, and has a potential of becoming a strong tool for creating a novel electronics device.

On the other hand, with regard to the above-mentioned semiconductor nanowire, a semiconductor nanowire 200 having a PN junction therein as illustrated in FIG. 10 is reported (see, for example, U.S. Pat. No. 6,882,051). U.S. Pat. No. 6,882,051 proposes applications to an LED, a solar cell, and a thermoelectric device by utilizing the PN junction in the nanowire.

Because an inorganic LED has a very high efficiency of 10 lm/W to 100 lm/W as compared with that of an organic EL device, and has a lifetime as long as several ten thousand hours, it is already put to practical use for various kinds of lighting and the like.

In the field of solar cells, studies on organic solar cells and dye-sensitized solar cells are carried out, but efficiencies thereof are lower than that of inorganic solar cells such as silicon solar cells and compound semiconductor solar cells. Thus, only the inorganic solar cells are put to practical use.

However, although the efficiency and lifetime of the inorganic LEDs and inorganic solar cells described above are already enough for practical use, because there are constraints on the substrate and a vacuum process is required, it is difficult to manufacture a large-area and low-cost device. Therefore, with regard to the area and the cost, the inorganic LEDs and inorganic solar cells are inferior to organic EL devices, organic solar cells, and dye-sensitized solar cells.

Thus, in U.S. Pat. No. 6,882,051, the semiconductor nanowire 200 is located on a substrate 201 as illustrated in FIG. 11, and is sandwiched between a pair of electrodes 202 to manufacture a device. By manufacturing a device having such the structure, a large-area and low cost semiconductor device can be manufactured with performance of an inorganic device maintained, and there is a potential for supplying, for example, a large-area lighting or solar cell at a low cost.

SUMMARY OF THE INVENTION

However, in a conventional technique, when a display apparatus or an image pick-up apparatus is required to be formed using nanowires, switching portions (for example, field effect transistors) have to be provided separately, causing a problem in that a structure of the apparatus becomes complicated.

In view of these problems, the inventors of the present invention have reached an epoch-making idea of forming a portion which functions as a light-receiving or light-emitting region and a portion for performing a switching operation using the same nanowire.

According to an aspect of the present invention, there is provided a semiconductor device including: a semiconductor nanowire having a first region with one of a PN junction and a PIN junction and a second region with a field effect transistor structure; a pair of electrodes connected to both ends of the semiconductor nanowire; and a gate electrode provided in at least a part of the second region via an insulating layer, in which: the semiconductor nanowire has a P-type semiconductor portion and an N-type semiconductor portion; and one of the P-type semiconductor portion and the N-type semiconductor portion is a common structural element of both the first and second regions.

According to another aspect of the present invention, there is provided a semiconductor device including: a semiconductor nanowire having a first region (with a PN junction portion or a PIN junction portion) with a P-type semiconductor portion and an N-type semiconductor portion forming at least one PN junction portion or with a P-type semiconductor portion, an intrinsic semiconductor portion and an N-type semiconductor portion forming at least one PIN junction portion, and a second region (with an FET structure) in which one of the P-type semiconductor portion and the N-type semiconductor portion forming one of the PN junction portion and the PIN junction portion of the first region is extended; a gate electrode located in at least a part of the second region of the semiconductor nanowire via an insulating layer; and a pair of electrodes connected to both ends of the semiconductor nanowire, in which the second region forms a field effect transistor.

According to still another aspect of the present invention, there is provided a semiconductor device including: a semiconductor nanowire having a first region with a first semiconductor portion and a second semiconductor portion forming at least one junction portion and a second region in which one of the first semiconductor portion and the second semiconductor portion forming the junction portion of the first region is extended; a gate electrode located in at least a part of the second region of the semiconductor nanowire via an insulating layer; and a pair of electrodes connected to both ends of the semiconductor nanowire, in which the second region forms a field effect transistor.

In the present invention, the junction structure is not limited to a PN junction structure or a PIN junction structure, and may be, for example, a double hetero structure, a quantum well structure, or a PIPIN structure.

According to the present invention, a function materialized by a semiconductor junction such as a PN junction or a PIN junction and an FET function can be exhibited at the same time. Further, it is possible to make small a connection resistance between a junction region such as a PN junction and a PIN junction and an FET region. Therefore, when a light-emitting device or a light-receiving device is formed with a semiconductor junction region such as a PN junction region, the light-emitting efficiency and a photoelectric conversion efficiency of the device as a whole can be made high.

Further features of the present invention will become apparent from the following description of exemplary embodiments with reference to the attached drawings.

DESCRIPTION OF THE EMBODIMENTS

Hereinafter, embodiment modes of the present invention will be described in detail with reference to the attached drawings, but the present invention is not limited thereto.

Figure 1A:
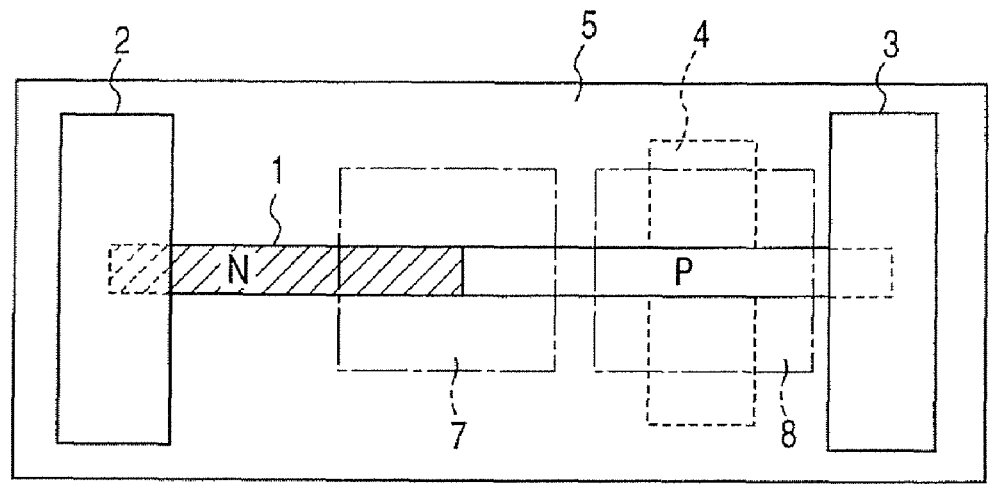
FIGS. 1A, 1B and 1C are plan views of an exemplary semiconductor device according to an embodiment mode of the present invention, a sectional view thereof, and an equivalent circuit diagram thereof, respectively.
Figure 1B:
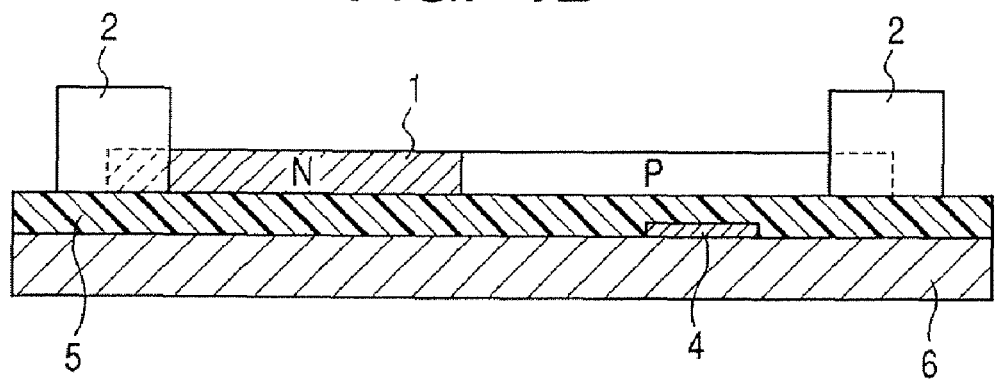
Figure 1C:
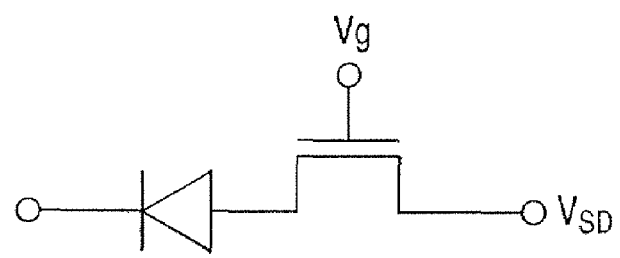

FIGS. 1A to 1C illustrate an exemplary embodiment mode of the present invention.

FIG. 1A is a plan view of a semiconductor device according to an embodiment mode of the present invention, FIG. 1B is a sectional view of the semiconductor device, and FIG. 1C is an equivalent circuit diagram of the semiconductor device. The semiconductor device illustrated in FIGS. 1A to 1C has a semiconductor nanowire 1 with a PN junction provided on a substrate 6, a pair of electrodes 2 and 3 (electrode 3 is to be a source electrode or a drain electrode) connected to both ends of the semiconductor nanowire 1, a gate electrode 4, and a gate insulating layer 5. The semiconductor nanowire 1 has a PN junction portion 7 as a first region and an FET 8 as a second region. The FET 8 is formed of either a P-type conduction portion (P-type semiconductor portion) or an N-type conduction portion (N-type semiconductor portion). Here, the FET 8 is formed of a P-type conduction portion.

A structure as illustrated in FIGS. 1A to 1C can control electric current flowing through the nanowire by controlling the gate voltage in the FET region.

The semiconductor nanowire 1 has a P-type conduction portion and an N-type conduction portion and has a diameter of several nanometers to several hundred nanometers. As for its length, although no particular limitation is imposed, it has a length of, for example, several tens of nanometers or more. It is unnecessary to say that a nanowire having a length of several micrometers or more is also a nanowire which falls within the scope of the present invention.

For example, the nanowire may have a diameter of about 2 nm to 300 nm and a length of about 1 μm to 5 μm.

Exemplary materials of the semiconductor nanowire 1 include compound semiconductors such as group II-VI compound semiconductors, group III-V compound semiconductors, group I-V compound semiconductor, group I-VI compound semiconductors, group I-VII compound semiconductors, group II-V compound semiconductors, group II-VII compound semiconductors, group III-VI compound semiconductors, and group IV-IV compound semiconductors, or group VI semiconductors. More specifically, Si, Ge, SiGe, AlGaAs, ZnO, ZnS, ZnSe, ZnTe, CdS, CdSe, CdTe, GaAs, GaN, GaAs, GaP, InP, InN, InAs, and a carbon nanotube may be included.

Figure 2:
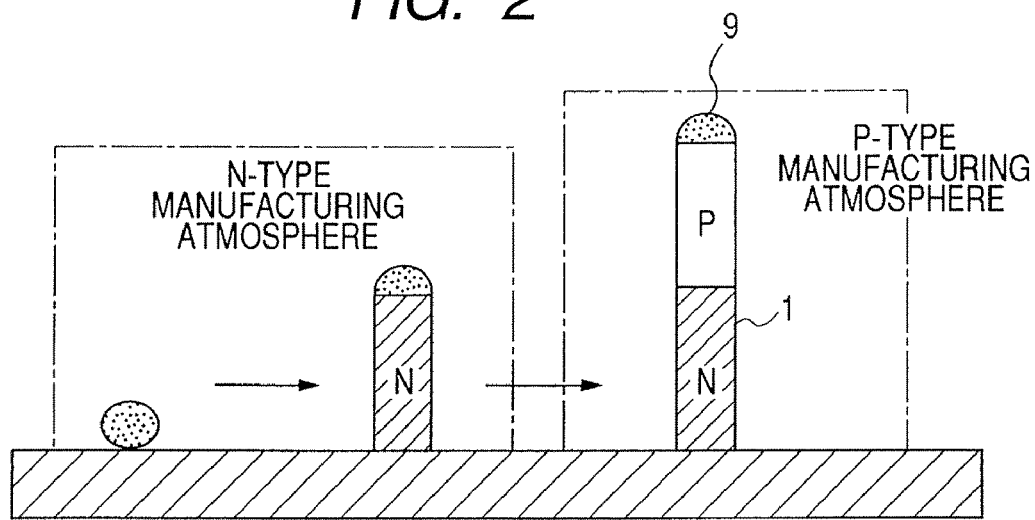
FIG. 2 illustrates a method of synthesizing a semiconductor nanowire by a VLS mechanism.

Although no particular limitation is imposed on the method of manufacturing the above-mentioned semiconductor nanowire, it is preferable that the semiconductor nanowire is manufactured by the VLS mechanism. The vapor-liquid-solid (VLS) mechanism is a method in which metal fine particles (such as gold, nickel, and cobalt) on a substrate and the substrate or a desired element form a molten compound alloy, which then decomposes a raw material gas to allow a nanowire to grow. This method is used to control an atmosphere of reaction gas and carry out doping as illustrated in FIG. 2, and a nanowire having both a P-type conduction portion and a N-type conduction portion can be provided. Because, in the VLS mechanism, the wire is grown selectively at a catalyst particle portion 9, the above-mentioned PN structure and PIN structure can be easily manufactured.

The electrode 2, the electrode 3, and the gate electrode 4 may be formed of any conductive material including platinum, gold, silver, nickel, chromium, copper, iron, tin, antimonial lead, tantalum, indium, aluminum, zinc, magnesium, and an alloy thereof, conductive metal oxide such as indium tin oxide, and inorganic and organic semiconductors with electrical conductivity thereof improved by doping or the like. Exemplary materials of the inorganic and organic semiconductors include monocrystalline silicon, polysilicon, amorphous silicon, germanium, graphite, polyacethylene, polyparaphenylene, polythiophene, polypyrrole, polyaniline, polyphenylenevinylene, and polyparaphenylenevinylene. The electrodes may be manufactured by the method of, for example, sputtering, deposition, printing of a solution or a paste, or inkjet printing.

Figure 3:
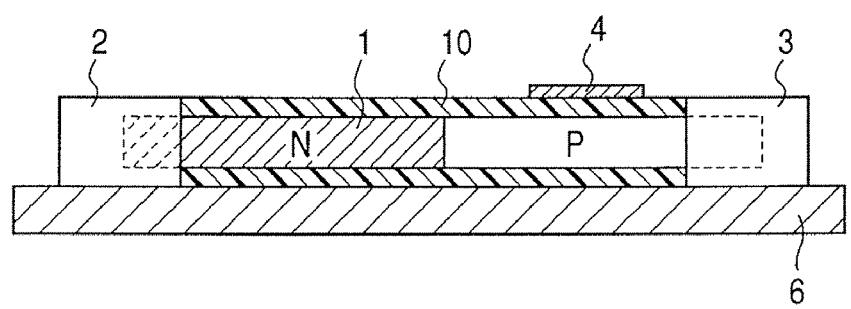
FIG. 3 illustrates an exemplary semiconductor device according to another embodiment mode of the present invention.

The gate insulating layer 5 may be formed of any insulating material as long as it has an insulating property, but is preferably made of a material with high permittivity and low electrical conductivity. Exemplary materials include inorganic oxides and nitrides such as silicon oxide, silicon nitride, aluminum oxide, titanium oxide, and tantalum oxide, and organic polymers such as polyacrylate, polymethacrylate, polyethylene terephthalate, polyimide, polyether, and siloxane-containing polymer. Further, among the above-mentioned insulating materials, one having high surface smoothness is preferable. Further, by covering the semiconductor nanowire with an insulator 10 as a gate insulating layer as illustrated in FIG. 3, a transistor can be formed without providing a gate insulating layer, which makes simpler the structure of the device. The insulator in this case may be formed of any insulating material as long as it has an insulating property. For example, the insulating layer may be formed by oxidizing or nitriding the surface of the semiconductor nanowire, or the semiconductor nanowire may be covered with a material other than the semiconductor nanowire, such as PZT, $Y_2O_3$, $ZrO_2$, or $HfO_2$. When the insulating layer is formed on the nanowire first, a source electrode and a drain electrode are formed after removing the insulating layer at the ends of the nanowire having the insulating layer formed thereon.

The substrate 6 may be formed of any material such as glass, ceramic, semiconductor, metal, or plastic, but it is preferable to use a glass substrate or a plastic substrate, which facilitates the reduction in cost. When a plastic substrate is used, because a flexible transistor can be provided, various kinds of flexible devices including a flexible display apparatus can be provided.

Figure 4:
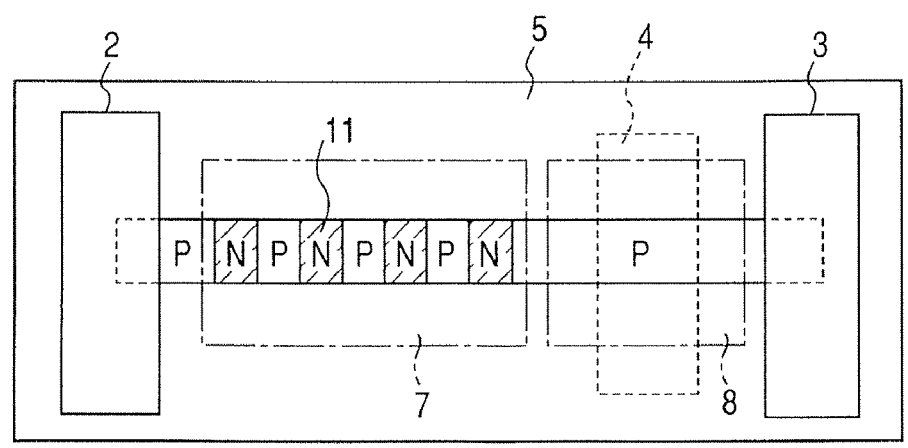
FIG. 4 illustrates an exemplary semiconductor device according to still another embodiment mode of the present invention.
Figure 5:
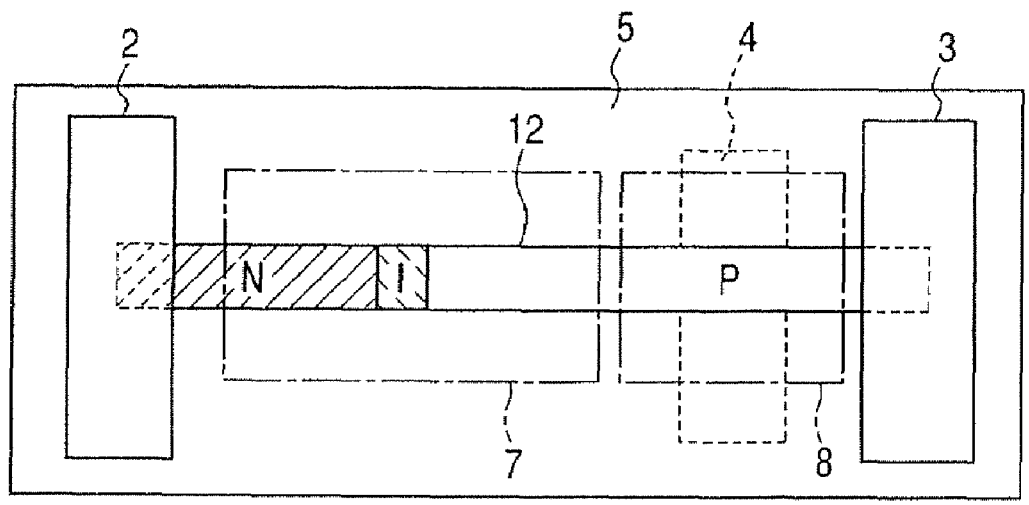
FIG. 5 illustrates an exemplary semiconductor device according to yet another embodiment mode of the present invention.

Although FIG. 1A shows the PN junction portion 7 of the semiconductor nanowire as one PN junction, a semiconductor nanowire 11 having a plurality of PN junctions as illustrated in FIG. 4 may also be used. Further, as illustrated in FIG. 5, a semiconductor nanowire 12 having a PIN ("I" refers to an intrinsic semiconductor portion) structure may also be used. It is to be noted that the above-mentioned junction structure includes structures such as a double hetero structure, a quantum well structure, and a PIPIN structure, and an appropriate structure may be selected depending on the application.

The method of arranging the semiconductor nanowires 1 is not particularly limited, but it is preferable to disperse the nanowires in a solvent and orient the nanowires using external force such as fluid force or an electric field. It is to be noted that the solvent used here, in which the nanowires are dispersed, may be appropriately selected such that the nanowires are easily dispersed according to the hydrophilicity/hydrophobicity of the nanowires and the zeta potential between the nanowires and the solvent.

Figure 6:
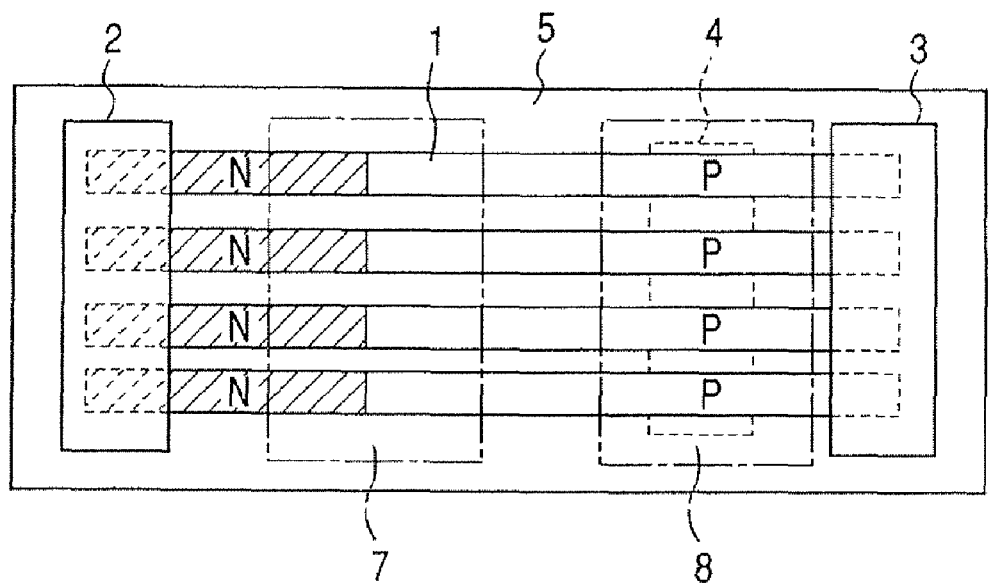
FIG. 6 illustrates an exemplary semiconductor device according to still another embodiment mode of the present invention.

It is to be noted that, although a case where only one semiconductor nanowire is present between the electrodes 2 and 3 is illustrated in FIGS. 1A and 1B, a case where a plurality of semiconductor nanowires 1 are present between the electrodes 2 and 3 as illustrated in FIG. 6 also falls within the scope of embodiment modes of the present invention.

Further, although the semiconductor nanowire 1 is located on the substrate in FIGS. 1A and 1B, a case where there is no substrate 6 also falls within the scope of embodiments of the present invention.

Figure 7:
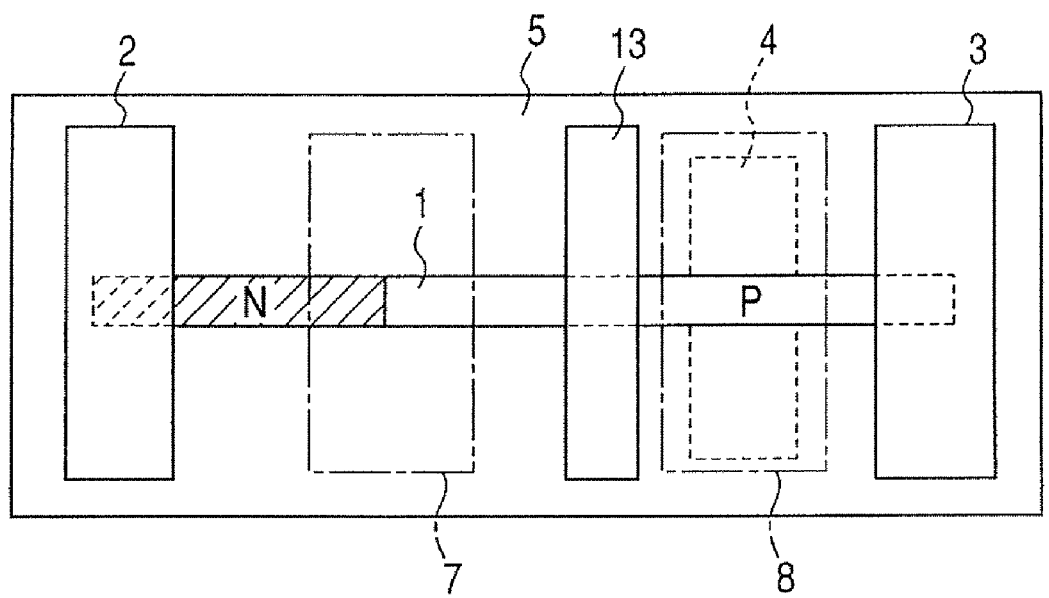
FIG. 7 illustrates an exemplary semiconductor device according to yet another embodiment mode of the present invention.

Further, the semiconductor device according to the embodiment mode of the present invention can independently vary the voltage applied to the above-mentioned PN junction portion and the voltage applied to the above-mentioned FET by providing an electrode 13 between the PN junction portion and the FET as illustrated in FIG. 7.

With such the structure, optimum voltage to be applied to the nanowire can be selected at both the PN junction portion and the FET, and thus, a semiconductor device having higher performance can be provided.

Figure 8:
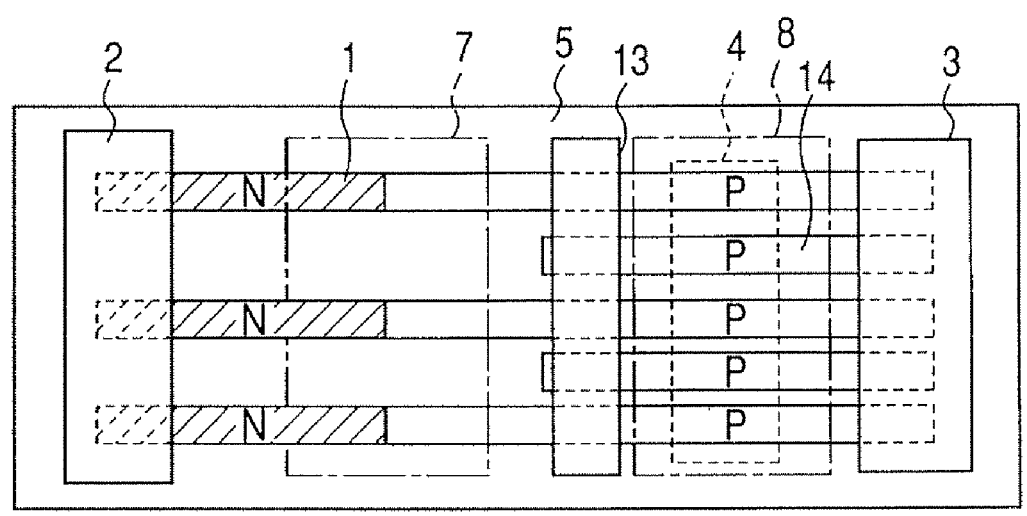
FIG. 8 illustrates an exemplary semiconductor device according to still another embodiment mode of the present invention.

Further, as illustrated in FIG. 8, when additional semiconductor nanowire 14 is located only in the FET portion, a value of the electric current flowing through the PN junction portion can be increased. When the PN junction portion 7 of this embodiment mode is used for a light-emitting device, in order to improve the brightness it is required to increase the electric current flowing through the LED. Therefore, the structure illustrated in FIG. 8 is particularly suitable when the PN junction portion 7 is used for a light-emitting device. It is to be noted that, although not shown, the number of nanowires in the PN junction portion may be increased.

Figure 9:
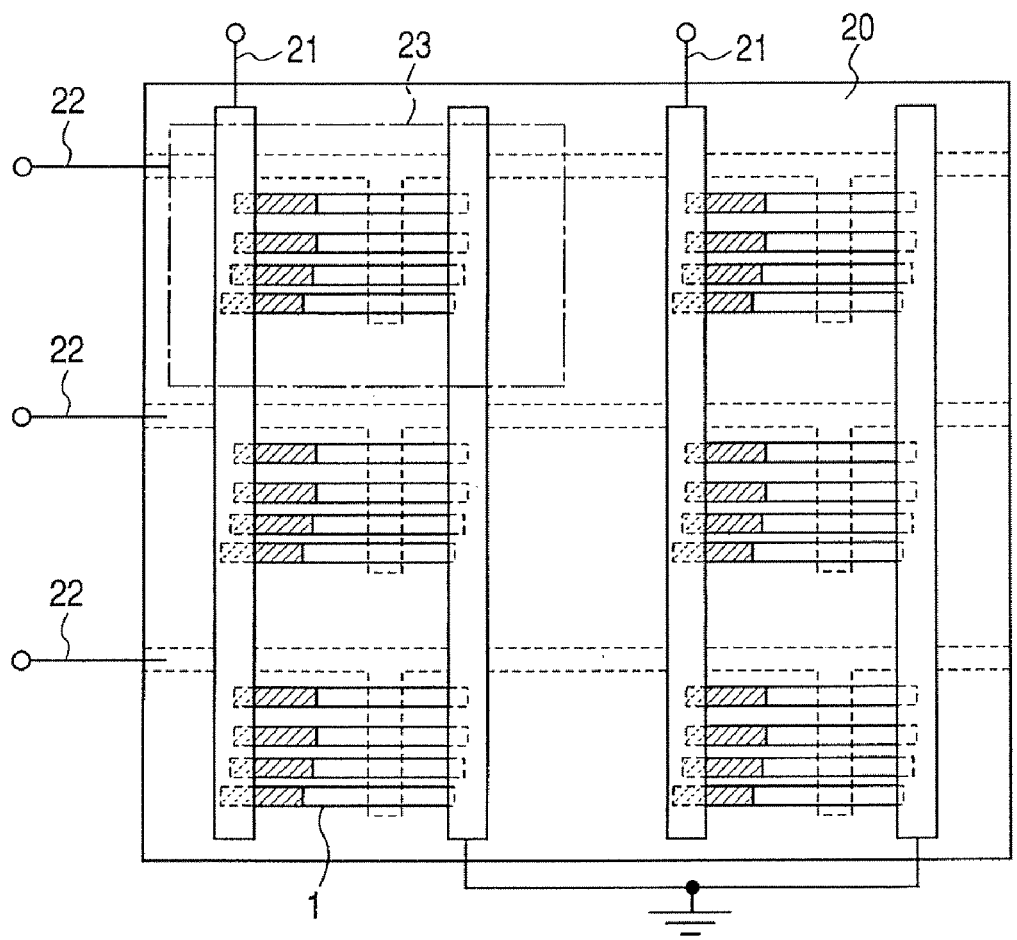
FIG. 9 illustrates an exemplary arrangement of a plurality of semiconductor devices according to another embodiment mode of the present invention.
Figure 10:
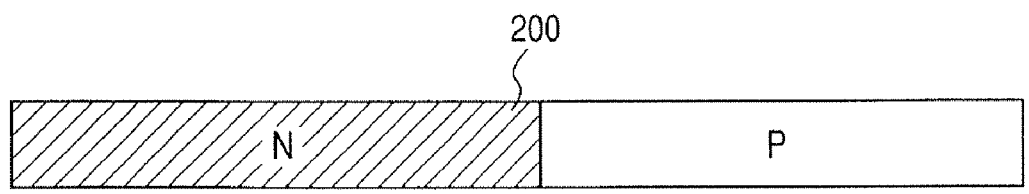
FIG. 10 illustrates a semiconductor nanowire with a PN junction.
Figure 11:
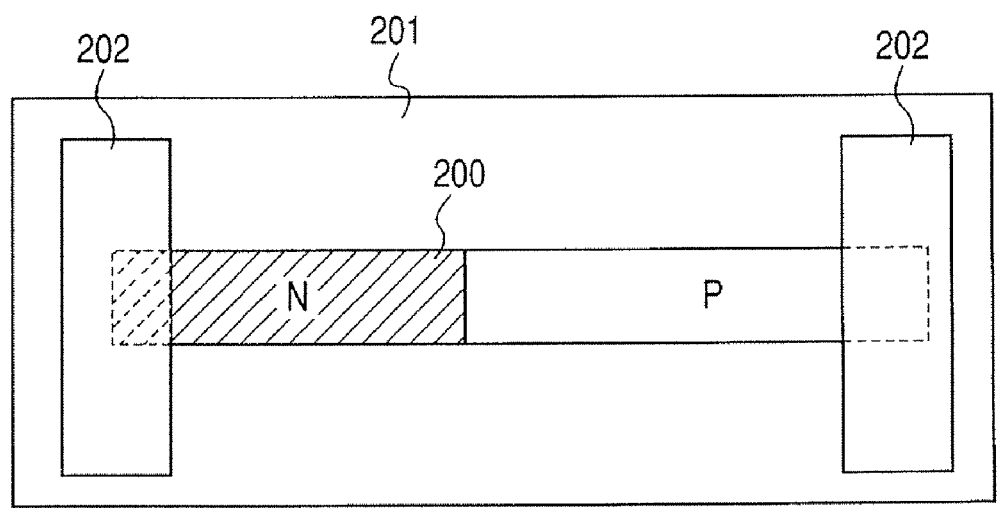
FIG. 11 illustrates a semiconductor device equipped with electrodes attached to the semiconductor nanowire with the PN junction.

Next, a case where a plurality of the above-mentioned semiconductor devices are arranged and the respective devices are addressed is described. FIG. 9 illustrates an exemplary case where a plurality of semiconductor devices are present on a same substrate 20. By applying voltage $V_g$ to each of gate lines 22 simultaneously with scanning voltage $V_{SD}$ applied to each of source lines 21, ON/OFF control of each device is carried out. For example, in a case where only a semiconductor device 23 in FIG. 9 is turned on, voltage $V_g$ is applied to the gate line 22 when voltage $V_{SD}$ is applied to the source line 21.

Because each device has a function of an FET in this embodiment mode, a display apparatus can be provided by building in an LED structure at the PN junction portion. In particular, by using materials which emit red light, green light, and blue light with respect to LEDs, a full-color display apparatus can be provided.

Further, by building in a photodiode structure at the PN junction portion, an image pick-up apparatus can be provided. Here, by providing a color filter for the above-mentioned image pick-up apparatus, a color image pick-up apparatus can be provided.

Because the semiconductor device according to this embodiment mode has the PN junction portion and the FET portion, a display apparatus and an image pick-up apparatus can be manufactured with a simple device structure. It is to be noted that the device structure according to the present invention is not limited to the one illustrated in FIG. 9, and it may be a structure with a capacitor additionally provided or a structure with a plurality of transistors, for example.

Further, by introducing N-type impurities into the P-type conduction portions of the region of the FETs 8 from the periphery to form N-type conduction portions for forming PN junction portions in the periphery of the P-type conduction portions, and forming gate electrodes on the N-type conduction portions, junction FETs can be formed.

It is to be noted that, because a device can be manufactured with a semiconductor nanowire using a coating process, a light-receiving or light-emitting region and a switching region can be manufactured using one coating process as described above.

With such the structure, the PN junction portion or the PIN junction portion which exhibits a function originated from the PN junction or the PIN junction and the FET which exhibits a function of a transistor can be provided in the semiconductor nanowire.

With such a structure of the semiconductor device, the device can exhibit a switching function. Therefore, when a large number of such semiconductor devices are provided on one substrate, each device can be addressed without additionally providing a TFT, resulting in cost reduction of the device. Further, by appropriately selecting the PN junction portion or the PIN junction portion, desired functions originated from the PN junction or the PIN junction, such as light emission or photoelectric conversion, can be exhibited more efficiently.

The above-mentioned semiconductor nanowire can be manufacture by the vapor-liquid-solid (VLS) mechanism using catalyst particles. Because nanowires grow selectively at catalyst particle portions in the VLS mechanism, the above-mentioned PN structure or PIN structure can be manufactured easily without forming a core-shell structure.

Further, the semiconductor device may have an electrode provided between the first region (PN junction or PIN junction) and the second region (FET).

By providing the electrode, the voltage applied to the PN junction portion or the PIN junction portion and the voltage applied to the FET can be varied independently.

Therefore, optimal voltages at which the function of the PN junction portion or the PIN junction portion and the function of the FET are respectively exhibited can be applied, resulting in the achievement of higher performance of the device. Further, the number of nanowires in the PN junction portion or the PIN junction portion and the number of nanowires in the FET can be varied, so the value of the electric current flowing through the respective regions can be easily controlled.

Further, the semiconductor device can be structured such that a plurality of semiconductor nanowires are connected in parallel with each other to a pair of electrodes. Because such a structure increases the area of the function-exhibiting region of the PN junction portion or the PIN junction portion, compared with a case where only one semiconductor nanowire is present, a semiconductor device having higher performance can be provided.

Further, the first region can be used as a light-emitting device. By providing a light emitting function to the PN junction or the PIN junction, a semiconductor device having both the FET function and the light emitting function can be provided. Because the FET function and the light emitting function can be provided to the same semiconductor nanowire, a semiconductor device having a switching function can be provided with a very simple structure.

Further, the first region can be used as a light-receiving device. By providing a function of a photodiode to the PN junction portion or the PIN junction portion, a semiconductor device having both the functions of the FET and the photodiode can be provided. Because the functions of the FET and the photodiode can be provided to the same semiconductor nanowire, a semiconductor device having a switching function can be provided with a very simple structure.

Further, a display apparatus can be provided by arranging one-dimensionally or two-dimensionally the semiconductor devices having the first regions as a light-emitting device. Because the semiconductor devices also have the function of FET, by arranging the semiconductor devices one-dimensionally or two-dimensionally a display apparatus having a function of TFT can be provided. Because it is unnecessary to provide additional TFTs for the display apparatus, a display apparatus can be provided with a very simple structure as compared with conventional display apparatus.

Further, an image pick-up apparatus can be provided by arranging one-dimensionally or two-dimensionally the semiconductor devices having the first regions as a light-receiving device. Because the semiconductor devices also have the function of FET, by arranging the semiconductor devices one-dimensionally or two-dimensionally a display apparatus having a function of TFT can be provided. Because it is unnecessary to provide additional TFTs for the image pick-up apparatus, an image pick-up apparatus can be provided with a very simple structure as compared with conventional image pick-up apparatus.

EMBODIMENTS

Although the following is a specific description of embodiments according to the present invention, the present invention is not limited thereto.

First Embodiment

In this embodiment, a case where the present invention is applied to a display apparatus is shown. Here, semiconductor nanowires made of GaN are used. The nanowires are manufactured by the VLS mechanism.

The method of manufacturing the display apparatus is as follows. First, Au fine particles having a particle size of 50 nm are formed on a sapphire substrate. After that, the substrate is heated to 900° C. in an atmosphere of trimethylgallium (TMGa) and ammonia to manufacture GaN nanowires to be a buffer layer.

Then, in order to manufacture N-type GaN thereon, the nanowires are grown in an atmosphere of trimethylgallium (TMGa), silane gas, and ammonia to manufacture an n-GaN:Si layer. Then, as an active layer, an InGaN layer is manufactured thereon in an atmosphere of trimethylgallium (TMGa), trimethylindium (TMIn), and ammonia. Then, in order to manufacture P-type GaN, the substrate is heated to 900° C. in an atmosphere of cyclopentadienylmagnesium ($Cp_2Mg$) gas, trimethylgallium (TMGa), and ammonia to form a GaN:Mg layer. Finally, by carrying out annealing at 600° C. in an atmosphere of nitrogen, semiconductor nanowires having a LED structure are obtained. The respective thickness of the layers of the nanowires obtained as described above are about 5 µm for GaN, about 10 µm for n-GaN:Si, about 10 nm for InGaN, and about 10 µm for p-GaN:Mg. The nanowires obtained by the above-mentioned method are dispersed in an ethanol solution. The nanowires can be separated from the substrate by ultrasound.

On the other hand, on the side of a substrate, gate electrodes are patterned on a glass substrate, and a silica film is formed thereon as a gate insulating layer.

Then, by allowing the solution in which the nanowires are dispersed to flow on the substrate obtained by the above-mentioned method, the nanowires are arranged. After that, Ti/Au electrodes as source/drain electrodes are formed by deposition.

A display device which emits blue light is formed by the method described above. Because a transistor and an LED can be formed at the same time in the display device manufactured in this embodiment, a display device with a simple structure can be provided.

Second Embodiment

In this embodiment, a case where the present invention is applied to a two-dimensional display sensor is shown. Here, semiconductor nanowires made of silicon are used. The nanowires are manufactured by the VLS mechanism. The method of manufacturing the two-dimensional display sensor is as follows. First, Au fine particles having a particle size of 50 nm are formed on a silicon substrate. After that, the substrate is heated to 450° C. in an atmosphere of $SiH_4$ and $PH_3$ gas to form P-doped N-type Si nanowires. Then, the substrate is heated at 450° C. in an atmosphere of $SiH_4$ and $B_2H_6$ gas to form P-type Si nanowires on the N-type Si nanowires. Finally, by carrying out annealing at 500° C. in an atmosphere of nitrogen, photodiode nanowires having PN junctions are obtained. The respective thickness of the nanowires obtained as described above are about 10 μm for the N-type and about 30 μm for the P-type. The nanowires obtained by the above-mentioned method are dispersed in an ethanol solution.

On the other hand, on the side of the substrate, gate electrodes are patterned on a glass substrate, and a silica film is formed thereon as a gate insulating layer.

Then, by allowing the solution in which the nanowires are dispersed to flow on the substrate obtained by the above-mentioned method, the nanowires are arranged. After that, Ti/Au electrodes as source/drain electrodes are formed by deposition.

A display device which emits blue light is formed by the method described above. Because a transistor and a photodiode can be formed at the same time in the display device manufactured in this embodiment, a two-dimensional photo sensor with a simple structure can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-352571, filed Dec. 6, 2005, which is hereby incorporated by reference herein in its entirety.

What is claimed is:

1. A semiconductor device, comprising:
   a semiconductor nanowire having a P-type semiconductor portion and an N-type semiconductor portion;
   a pair of electrodes connected to both ends of the semiconductor nanowire; and
   a gate electrode provided with respect to either one of the P-type semiconductor portion and the N-type semiconductor portion via an insulating layer,
   wherein a first region having one of a PN junction and a PIN junction and a second region having one of the P-type semiconductor and the N-type semiconductor as a channel region of a field effect transistor, the insulating layer as a gate insulating film, and the gate electrode are formed in different positions.

2. A semiconductor device according to claim 1, wherein a plurality of the semiconductor nanowires are connected in parallel with each other to the pair of electrodes.

3. A semiconductor device according to claim 1, wherein the first region is a light-emitting region.

4. A semiconductor device according to claim 1, wherein the first region is a light-receiving region.

5. A display apparatus, comprising a plurality of the semiconductor devices according to claim 3 arranged in one of a one-dimensional manner and a two-dimensional manner.

6. An image pick-up apparatus, comprising a plurality of the semiconductor devices according to claim 4 arranged in one of a one-dimensional manner and a two-dimensional manner.

7. A semiconductor device according to claim 1 further comprising a controlling electrode between the first region and the second region of said semiconductor nanowire.

8. A semiconductor device according to claim 2, further comprising:
   a controlling electrode between the first region and the second region of said plurality of semiconductor nanowires; and
   an additional plurality of semiconductor nanowires consisting of the second region only, said additional plurality of semiconductor nanowires connected on one end to the controlling electrode and on the other end to one electrode of said pair of electrodes.

* * * * *